(12) United States Patent
Tomiyama et al.

(10) Patent No.: US 6,489,014 B2
(45) Date of Patent: Dec. 3, 2002

(54) WIRING BOARD

(75) Inventors: Akitoshi Tomiyama, Nara (JP); Yasuhiko Shigeta, Nara (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/062,278

(22) Filed: Jan. 30, 2002

(65) Prior Publication Data
US 2002/0106450 A1 Aug. 8, 2002

(30) Foreign Application Priority Data
Jan. 30, 2001 (JP) ........................... 2001-022523

(51) Int. Cl.$^7$ ................................. B32B 3/00
(52) U.S. Cl. .................. 428/209; 428/210; 428/901; 174/255
(58) Field of Search ................. 428/209, 210, 428/901; 174/255

(56) References Cited
U.S. PATENT DOCUMENTS
5,084,323 A * 1/1992 Nagasaka et al. ........... 428/137
* cited by examiner Primary Examiner—Cathy Lam
(74) Attorney, Agent, or Firm—Hogan & Hartson, LLP

(57) ABSTRACT

A wiring board with high reliability capable of effectively preventing the occurrence of migration includes a substrate 1, a glass layer 2 deposited on the top face of the substrate 1, a plurality of conductive layers 3 deposited on the surface of the glass layer 2, and a plurality of plating layers 4 correspondingly deposited for covering the surface of each of the conductive layers 3. The glass layer 2 is partially protruded so as to surround and to overlap both sides of each conductive layer 3, and top ends of the protruded portions 2a are interposed between the conductive layer 3 and the plating layer 4. Even when a large difference in potentials is created between the adjacent conductive layers 3, 3 while the wiring board is used, the protruded portions 2a of the glass layer 2 sufficiently prevents the growth of the metal toward the adjacent conductive layer 3, and effectively prevents the occurrence of migration.

2 Claims, 1 Drawing Sheet

WIRING BOARD

BACKGROUND OF THE INVENTION

1. Field of the Invention

The present invention relates to a wiring board for use in constituting a head substrate and the like of an LED (Light Emitting Diode) array head.

2. Description of the Related Art

A wiring board has been conventionally used for constituting a head substrate of an LED array head.

A conventional wiring board has a structure as shown, for example, in FIG. 3. A plurality of conductive layers 12 are deposited into a predetermined pattern on the top face of a substrate 11 made of a material such as glass and ceramics. In addition, the surface of each conductive layer 12 is covered with a plating layer 13.

As a material of the conductive layers 12, a conductive material containing metal such as silver (Ag) or aluminum (Al) is used. The conductive layers 12 are formed in the following process. Silver powder, glass frit, organic flux and so on are mixed with each other to obtain a predetermined conductive paste. The resultant conductive paste is printed and applied into a predetermined pattern on the top face of the substrate 11 by a conventionally known method such as screen printing. Then, the conductive paste is baked at a temperature ranging from 350 to 800° C. to form the conductive layers 12.

The plating layer 13, which covers each of the conductive layers 12, is formed in order to achieve excellent bonding property at the time when an external electric circuit such as a semiconductor element and a flexible wiring board is bonded to the conductive layer 12, as well as to prevent the conductive layer 12 from corrosion. The plating layer 13 has been formed by a conventionally known method such as electric field plating where metal excellent in corrosion resistance such as nickel (Ni), gold (Au), chromium (Cr) or the like is selectively deposited on the surface of the conductive layer 12. When the plating layer 13 is formed by the method such as described above, the end portion of the plating layer 13 is extended to reach the top face of the substrate 11.

The above-described conventional wiring board, however, has the following problem. Whereas the end portion of the plating layer 13 is extended to reach the surface of the substrate 11 in such a manner that the plating layer 13 completely covers the entire conductive layer 12, the plating layer 13 is poor in adhesiveness to the substrate 11 in many cases. Due to this disadvantage, in the structure where a plurality of conductive layers 12 such as described above are arranged in parallel to each other at high density at intervals ranging from 10 to 100 μm, large difference in potentials is created between the adjacent conductive layers 12, 12 when electric power is selectively applied to each of the plurality of conductive layers 12. As a result, the metal such as silver and aluminum which forms the conductive layer 12 may cause migration growing in the form of tree toward the conductive layer 12 located at a positive potential side via a space between the substrate 11 and the plating layer 13. In this case, the adjacent conductive layers 12 are electrically short-circuited, so that it is impossible to use the wiring board having such a trouble.

SUMMARY OF THE INVENTION

The present invention has been made to solve the above-mentioned problems, and an objective thereof is to provide a wiring board with high reliability capable of effectively preventing the occurrence of migration.

A wiring board in accordance with an aspect of the present invent includes: a substrate; a glass layer deposited on a top face of the substrate; a plurality of conductive layers made of conductive material including silver or aluminum and deposited on a surface of the glass layer; and a plating layer made of at least one of metals selected from a group consisting of nickel, chromium, and gold and covering at least a part of a surface of each conductive layer, wherein the glass layer is partially protruded so as to surround and to overlap both sides of each conductive layer, and a top end of each protruded portion is interposed between the conductive layer and the plating layer.

By such the configuration, the edges of each conductive layer are overlapped with the protruded portions of the glass layer located under the conductive layer. In addition, the top end of each protruded portion is interposed between the conductive layer and the plating layer formed on the conductive layer. Thus, even when a large difference in potentials is created between the adjacent conductive layers while the wiring board is used, the protruded portion of the glass layer sufficiently prevents the growth of the metal such as silver or aluminum which forms the conductive layer toward the adjacent conductive layer, and effectively prevents the occurrence of migration. As a result, electric insulation between adjacent conductive layers can be assuredly maintained over a long period of time, and reliability of the wiring board can be increased.

DETAILED DESCRIPTION OF THE INVENTION

An embodiment of a wiring board in accordance with the present invention will be described in detail with reference to the accompanied drawings.

Figure 1:
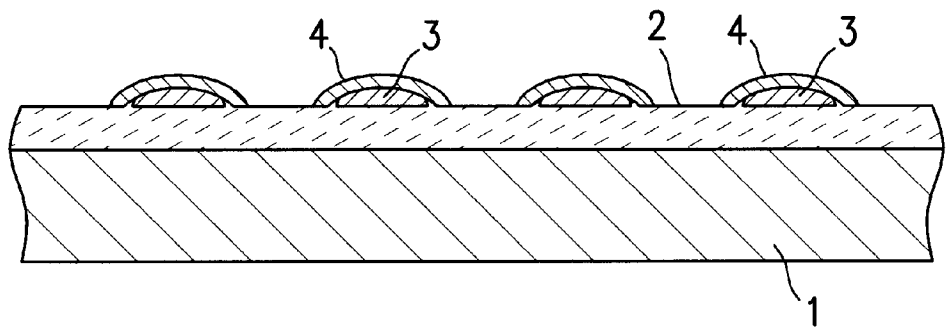
FIG. 1 is a cross-sectional view for showing a configuration of a wiring board in accordance with an embodiment of the present invention.
Figure 2:
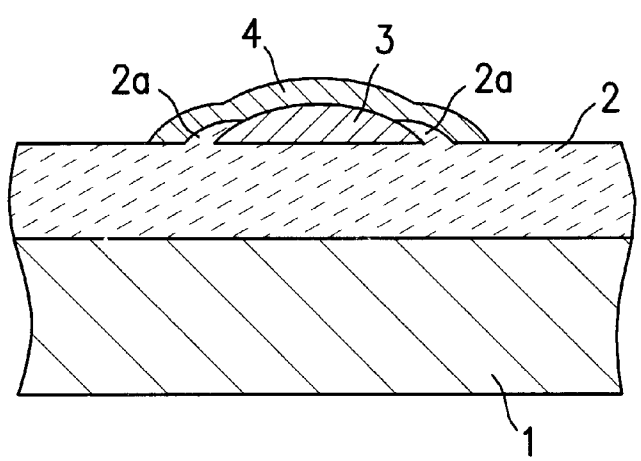
FIG. 2 is a magnified cross-sectional view of a main portion of the wiring board shown in FIG. 1.
Figure 3:
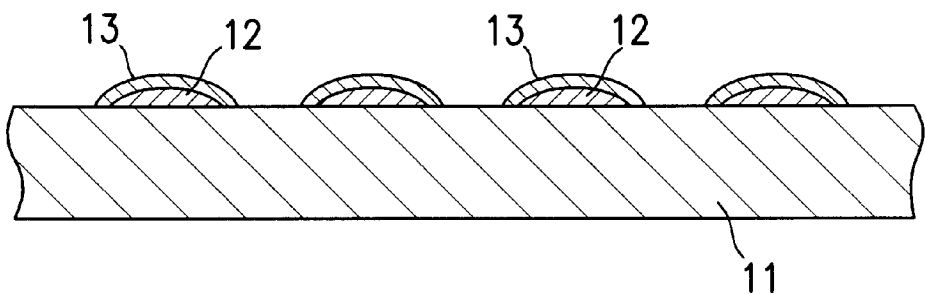
FIG. 3 is a cross-sectional view for showing a configuration of a conventional wiring board.

FIG. 1 is a cross-sectional view of a wiring board in accordance with the embodiment of the present invention. FIG. 2 is a magnified view of a main portion of FIG. 1. As shown in FIGS. 1 and 2, a glass layer 2 is deposited on a top face of a substrate 1. A plurality of conductive layers 3 are deposited on the glass layer 2. A plurality of plating layers 4 are correspondingly deposited so as to cover the conductive layers 3.

The substrate 1 is made of an electrically insulating material such as alumina ceramics, mullite, aluminum nitride, glass ceramics, quartz, alkaline glass, non-alkaline glass, or the like. The substrate 1 serves as a base material for supporting the glass layer 2, the conductive layers 3 and the plating layers 4 sequentially deposited and formed on the top face of the substrate 1.

For example, when the substrate 1 is made of alumina ceramics, it is manufactured in the following process. First, adequate organic flux and solvent are added into ceramics raw material powder such as alumina, silica, magnesia, or the like, and the mixture is mixed into the form of mud. The mixture is then formed into a ceramic green sheet (i.e. a ceramic raw sheet) by a conventionally known method such as doctor blading, calendaring, or the like. After that, the resultant green sheet is punched into a predetermined shape, and then is baked at high temperature (at about 1600° C.) to obtain the substrate 1.

The glass layer 2 is deposited over the entire top face of the substrate 1. The glass layer 2 serves as a base layer for depositing and forming the conductive layers 3. The glass layer 2 is partially protruded for surrounding both sides of the conductive layers 3.

The protruded portions 2a surrounding the both sides of each conductive layer 3 further overlaps the outer periphery portions of the conductive layer 3 in a manner to reach 1 μm or more inside region thereof. At this region, the protruded portion 2a is tightly attached to the outer periphery of the conductive layer 3.

As a glass material for forming the glass layer 2, bismuth-based borosilicate glass is used for example. The glass layer 2 is deposited and formed on the substrate 1 in the following process. First, adequate organic flux, organic binder, and so on are added into the powder of glass such as described above, and the mixture is mixed to obtain a predetermined glass paste. Thus-obtained glass paste is printed and applied over the entire top face of the substrate 1 by a conventionally known method such as screen printing, or the like. Then, the glass paste is baked at high temperature (ranging from 350 to 1000° C.) into a thickness of 5 to 50 μm to form the glass layer 2.

On the surface of the glass layer 2, a plurality of conductive layers 3 are deposited and formed. The surface of each conductive layer 3 is further covered with the plating layer 4.

The conductive layer 3 is made of conductive material such as sliver or aluminum, or conductive material containing 85 weight percent or more of silver or aluminum. The conductive layers 3 are patterned 1 at high density with an interval of 10 to 100 μm between adjacent conductive layers 3 onto the surface of the glass layer 2 on the substrate 1.

While the wiring board is used, electric power of 5 mW to 15 mW is selectively applied to each of the conductive layers 3 by a switching transistor (not-shown). In this structure, specific electric field may be applied to adjacent conductive layers in some cases.

The conductive layers 3 are deposited and formed into a predetermined pattern on the surface of the glass layer 2 so as to have, for example, a thickness of 3 to 20 μm by a conventionally known thick film forming method. Specifically, the conductive layers 3 are formed in the following process. First, silver powder, glass frit, organic binder, organic solvent and so on are mixed to obtain a predetermined conductive paste. The conductive paste is printed and applied onto the surface of the substrate 1 into a predetermined pattern by a conventionally known method such as screen printing and the like. Then, the conductive paste is baked at a temperature a little higher than a softening temperature of the glass which forms the glass layer 2. For example, when the softening temperature of the glass layer 2 is 530° C., the conductive paste is baked at 550° C. As a result, the conductive layers 3 are formed. At the same time, the glass layer 2 is partially softened and protruded at both sides of each of the conductive layer 3, so that the edges of the conductive layer 3 is overlapped with the protruded portions. At this time, in order to obtain increased adhesiveness between the conductive layer 3 and the glass layer 2, and to obtain excellent sealing effect by the plating layer 4, it is preferable to constitute the glass frit to be added to the conductive paste by use of glass of the same quality as the glass used for the glass layer 2.

The plating layer 4 for covering the surface of each conductive layer 3 is formed by depositing metal such as gold (Au), chromium (Cr), nickel (Ni), or the like into a thickness of, for example, 0.1 to 15 μm onto the surface of the conductive layer 3. The end portion of the plating layer 4 is extended over the protruded portions 2a to reach the surface of the glass layer 2.

The plating layers 4 are formed to achieve excellent bonding property at the time when an external electric circuit such as semiconductor device, a flexible wiring board, or the like is bonded to the conductive layers 3, and also to prevent the conductive layers 3 from corrosion caused by the contact with moisture contained in the air, or the like. The plating layers 4 are formed by a conventionally known method such as electric field plating, or the like, where metal excellent in corrosion resistance such as nickel, gold, chromium and the like is selectively deposited onto the surface of each of the conductive layers 3 and the outer surface of the protruded portions 2a of the glass layer 2.

Thus-formed plating layer 4 is tightly attached with extremely high adhesiveness to the surface of each conductive layer 3 as well as to the outer surface of the protruded portions 2a. The top ends of the protruded portions 2a are interposed between the plating layer 4 and the conductive layer 3.

As described above, the edges of each conductive layer 3 are overlapped with the protruded portions 2a of the glass layer 2, and the top ends of the protruded portions 2a are interposed between the conductive layer 3 and the plating layer 4. Owing to this structure, even when a large difference in potentials is created between the adjacent conductive layers 3, 3 while the wiring board is used, the protruded portions 2a of the glass layer 2 sufficiently prevent the growth of the metal such as silver or aluminum which forms the conductive layer 3 toward the adjacent conductive layer 3, and the occurrence of migration can efficiently be prevented. As a result, the electric insulation between adjacent conductive layers 3, 3 can be assuredly maintained over a long period of time, and reliability of the wiring board can be increased.

In addition, the protruded portions 2a cover the outer peripheries of each conductive layer 3 in the state of extending beyond the edge of the conductive layer 3 to reach 1 μm or more inside region thereof. This structure assuredly prevents the occurrence of migration even in severe environment at high temperature and high humidity. As a result, a wiring board of higher reliability can be obtained.

Further, when the glass layer 2 is arranged to contain alkaline metal components such as sodium and potassium at 5 weight percent or lower, and more preferably 1 weight percent or lower, moisture is hard to attach to the surface of the glass layer 2. In this case, the occurrence of migration can be prevented more effectively.

The present invention is not limited to the embodiment described above, but various changes and modifications may be possible within the scope of the present invention.

For example, in the embodiment described above, the plating layers 4 are formed by electric field plating method. Alternatively, the plating layers 4 may be formed by electroless plating method.

Further, in the embodiment described above, the entire surface of each conductive layer 3 is covered with the plating layer. Alernatively, the surface of each conductive layer 3 may be partially covered with plating layer 4. For example, a portion of the conductive layer 3 to which an external electric circuit is bonded is covered with the plating layer 4, and the remaining portions are covered with a protective film made of material such as glass and epoxy resin.

Further, in the embodiment described above, each plating layer 4 is in a single layered structure. Alternatively, the plating layer 4 may be in a two-layered structure where a nickel plating layer and a gold plating layer are laminated to each other.

The present invention is also applicable to the case where each conductive layer 3 is in a multilayered structure where a plurality of conductive layers are laminated to each other with an insulating layer interposed therebetween.

In the wiring board in accordance with the present invention, an edge of each conductive layer is covered with an protruded portion of the glass layer as a base layer located under the conductive layers. In addition, the top end of each of the protruded portion is interposed between the conductive layer and the plating layer formed on the conductive layer. By such the structure, even when a large difference in potentials is created between the adjacent conductive layers while the wiring board is used, the protruded portions of the glass layer sufficiently prevents the growth of the metal such as silver or aluminum which forms the conductive layer toward the adjacent conductive layer, and effectively prevents the occurrence of migration. As a result, electric insulation between adjacent conductive layers can be assuredly maintained over a long period of time, and reliability of the wiring board can be increased.

This application is based on patent application No. 2001-22523 filed in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be constructed as being included therein.

What is claimed is:

1. A wiring board including: a substrate; a glass layer deposited on a top face of the substrate; a plurality of conductive layers made of conductive material including silver or aluminum and deposited on a surface of the glass layer; and a plating layer made of at least one of metals selected from a group consisting of nickel, chromium, and gold and covering at least a part of a surface of each conductive layer, wherein the glass layer is partially protruded so as to surround and to overlap both sides of each conductive layer, and a top end of each protruded portion is interposed between the conductive layer and the plating layer.

2. The wiring board in accordance with claim 1, wherein the protruded portion overlaps the outer periphery of each conductive layer in the state of extending beyond an edge of the conductive layer to reach 1 $\mu$m or more inside region thereof.

* * * * *